(12) United States Patent
Murakami et al.

(10) Patent No.: US 6,611,376 B1
(45) Date of Patent: *Aug. 26, 2003

(54) DIFFRACTIVE OPTICAL ELEMENT AND METHOD OF MANUFACTURING THE SAME

(75) Inventors: Eiichi Murakami, Utsunomiya (JP); Seiji Takeuchi, Tucson, AZ (US)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,480

(22) Filed: Jun. 2, 1998

(30) Foreign Application Priority Data

Jun. 6, 1997 (JP) .............................. 9-165067

(51) Int. Cl.[7] .......................... G02B 27/44; G02B 5/18; G01B 9/00
(52) U.S. Cl. ....................... 359/566; 359/900; 359/569; 356/124; 356/127
(58) Field of Search ................................ 359/565, 566, 359/570, 900, 569; 356/124, 127; 216/26; 51/284 R

(56) References Cited

U.S. PATENT DOCUMENTS

| | | | |
|---|---|---|---|
| 4,895,790 A | 1/1990 | Swanson et al. | 430/321 |
| 4,936,665 A | 6/1990 | Whitney | 350/451 |
| 5,089,023 A * | 2/1992 | Swanson | 359/565 |
| 5,149,337 A * | 9/1992 | Watanabe | 51/284 R |
| 5,156,943 A | 10/1992 | Whitney | 430/321 |
| 5,161,059 A | 11/1992 | Swanson et al. | 359/565 |
| 5,218,471 A | 6/1993 | Swanson et al. | 359/565 |
| 5,227,915 A * | 7/1993 | Grossinger et al. | 359/565 |
| 5,344,447 A * | 9/1994 | Swanson | 359/565 |
| 5,386,319 A | 1/1995 | Whitney | 359/575 |
| 5,479,238 A | 12/1995 | Whitney | 355/53 |
| 5,638,169 A * | 6/1997 | Hollmann et al. | 356/127 |
| 5,715,091 A * | 2/1998 | Meyers | 359/565 |
| 5,843,321 A * | 12/1998 | Kamihara et al. | 216/26 |

* cited by examiner

*Primary Examiner*—Audrey Chang
(74) *Attorney, Agent, or Firm*—Fitzpatrick, Cella, Harper & Scinto

(57) ABSTRACT

The present invention discloses a diffractive optical element whose optical axis can be precisely positioned, and a method of manufacturing the diffractive optical element. The diffractive optical element includes a region provided with a concentric uneven pattern and having a predetermined light bending characteristic, and a peripheral section worked so that the optical axis of the diffractive optical element determined by the light bending characteristic of the region aligns with the center of the profile of the diffractive optical element.

8 Claims, 11 Drawing Sheets

SEMICONDUCTER DEVICE MANUFACTURING PROCESS

WAFER FORMING PROCESS

BINARY OPTICAL ELEMENT
MANUFACTURING PROCESS

DIFFRACTIVE OPTICAL ELEMENT AND METHOD OF MANUFACTURING THE SAME

BACKGROUND OF THE INVENTION

1. Field of the Invention

The present invention relates to a diffractive optical element for use in an optical system of a high-resolution imaging system, and a method of manufacturing the diffractive optical element.

2. Description of the Related Art

With the recent increase in density of integrated circuits, a projection exposure apparatus, which is used for manufacturing a semiconductor device, needs to project a circuit pattern formed on a reticle onto a wafer by exposure with higher resolution. For that purpose, the numerical aperture of a projection optical system has been increased, and the number of lenses that make up the optical system has also been increased. In addition, there has been a demand for a larger screen. As a result, the projection exposure apparatus has increased in size and cost.

Furthermore, the wavelength of exposure light has been shortened from the spectral i-line that is a bright-line spectrum of Hg, to 248 nm of laser light to be emitted from a KrF excimer laser or an ArF excimer laser, and to 193 nm of ultraviolet light. This limits the available lens materials, and therefore makes it difficult to correct chromatic aberration of the optical system. In order to solve this problem, an attempt has recently been made to incorporate a binary optical element, which is a blazed transmissive grating formed of a concentric grating on a plane-parallel plate, into the optical system.

A general-type of optical system is basically composed of spherical lenses. In the case of a spherical convex lens, the focal length increases as the wavelength increases. On the other hand, since the binary optical element having a similar light bending action to that of the lens utilizes the diffraction of light, its focal length decreases as the wavelength increases. Consequently, the incorporation of the binary optical element in the optical system makes it possible to easily correct chromatic aberration and to reduce the number of lenses.

In incorporating the above-mentioned binary optical element in the optical system, however, it is difficult to precisely adjust the optical axis. In a conventional lens system, a mechanical centering method and an optical centering method are adopted to adjust the optical axis. In the mechanical centering method, a lens 1 coated with oil is held by a clamp 2 from both sides, and the clamp 2 is turned, as shown in FIG. 10. Thereby, the lens 1 is shifted so that the turn axis and the optical axis of the lens 1 align with each other, as shown in FIG. 11. This method is not applicable to the binary optical element because it is planar on both sides and is not shifted even when the clamp is turned.

In the optical centering method, a lens 1 is bonded to a turn jig 3 and turned as shown in FIG. 12, and the turn axis is shifted while viewing a crosshairs chart 4 and a reference mark chart 5 so that images of both the charts align with each other, thereby centering the optical axis of the lens 1. In this case, there is a need to previously align the optical axis of the binary optical element with the center of the turn jig 3, and therefore, precise adjustment of the optical axis is impractical.

SUMMARY OF THE INVENTION

Accordingly, it is an object of the present invention to provide a diffractive optical element whose optical axis can be positioned with high precision, and a method of manufacturing the diffractive optical element.

In order to achieve the above object, according to one aspect, the present invention provides a diffractive optical element including a region provided with a concentric uneven pattern and having a predetermined light bending characteristic, and a peripheral section worked so that the center of the profile of the diffractive optical element aligns with the optical axis of the diffractive optical element determined by the light bending characteristic of the region.

According to another aspect, the present invention provides a diffractive optical element manufacturing method including a first step of making a diffractive optical element provided with a concentric uneven pattern thereon, and a second step of working the periphery of the diffractive optical element so that the optical axis and the center of the profile of the diffractive optical element align with each other.

According to a further aspect, the present invention provides a diffractive optical element manufacturing apparatus including turning means for turning a diffractive optical element about a predetermined turn axis, detection means for detecting the offset between the turn axis and the optical axis of the diffractive optical element, position adjustment means for adjusting the relative positions of the turn axis and the diffractive optical element based on the detection result of the detection means, and cutting means for cutting the periphery of the diffractive optical element.

In addition, optical equipment using the diffractive optical element of the present invention, in particular, a projection exposure apparatus, and a method of manufacturing a device by utilizing the projection exposure apparatus will be disclosed in the following description of the preferred embodiments of the present invention.

DETAILED DESCRIPTION OF THE PREFERRED EMBODIMENTS

The present invention will now be described in detail with reference to the preferred embodiments in connection with the attached drawings.

Figure 1:
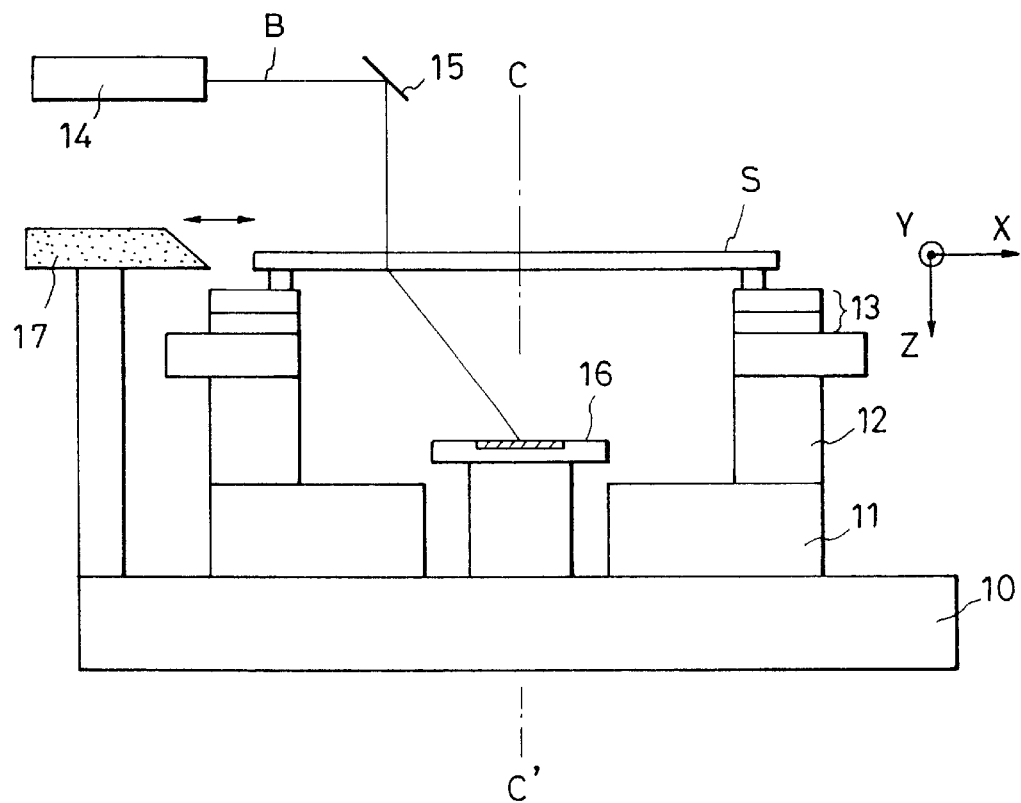
FIG. 1 is a side view of an apparatus for manufacturing a binary optical element according to a first embodiment of the present invention.
Figure 2:
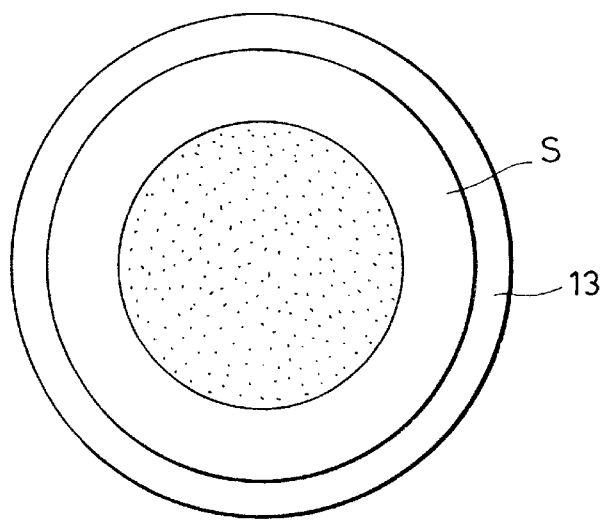
FIG. 2 is a plan view explaining the relationship between a binary optical element and an XY-stage.

FIG. 1 is a side view of an apparatus for manufacturing a binary optical element according to a first embodiment of the present invention. Referring to FIG. 1, a turnable θ-stage 11, a vertically movable Z-stage 12, and an XY-stage 13 that is horizontally movable in two dimensions, are mounted on a surface plate 10 in this order. As shown in FIG. 2 as a plan view, a binary optical element S is mounted on the XY-stage 13 so that its position in the XY directions relative to the turn center can be adjusted. Above the XY-stage 13, a laser light source 14 such as a He—Ne laser, and a reflecting mirror 15 are placed. A two-dimensional CCD sensor 16 is fixed on about the center of the surface plate 10 below the binary optical element S near a turn axis C–C'. In addition, a cutting tool 17 for cutting the periphery of the binary optical element S is placed on one side of the surface plate 10.

For positioning, the binary optical element S, on which a concentric uneven pattern is formed, is laid on the XY-stage 13, and turned by the θ-stage 11. While the binary optical element S is being turned, it is irradiated with laser light B from the laser source 14 via the reflecting mirror 15. The Z-stage 12 is moved near the paraxial image position so that the two-dimensional CCD sensor 16 is placed in a position where the laser light B is incident via the binary optical element S, and the laser light B is detected by the two-dimensional CCD sensor 16.

Figure 3A:
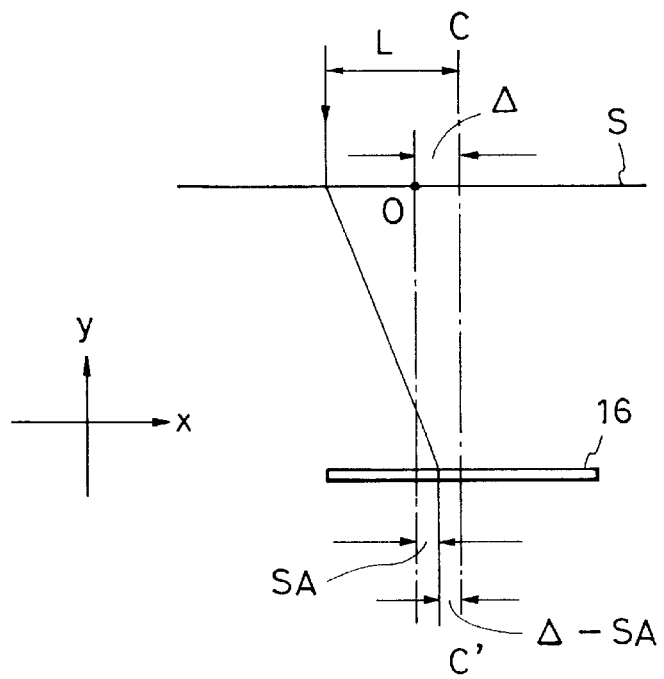
FIG. 3, consisting of FIGS. 3A and 3B, is an explanatory view showing the relationship between the optical axis and a turn axis.

FIG. 3A shows a case in which the center O of the binary optical element S is offset from the turn axis C–C' by a distance Δ when the binary optical element S is turned. When the laser light B is radiated onto the position shifted from the turn axis C–C' by a distance L, it is radiated onto the position shifted from the center O of the binary optical element S by a distance L–Δ. At this time, since the laser light B forms an image on the CCD sensor 16 with a spherical aberration SA corresponding to L–Δ, the amount of shift of the image position on the CCD sensor 16 is Δ–SA.

Figure 3B:
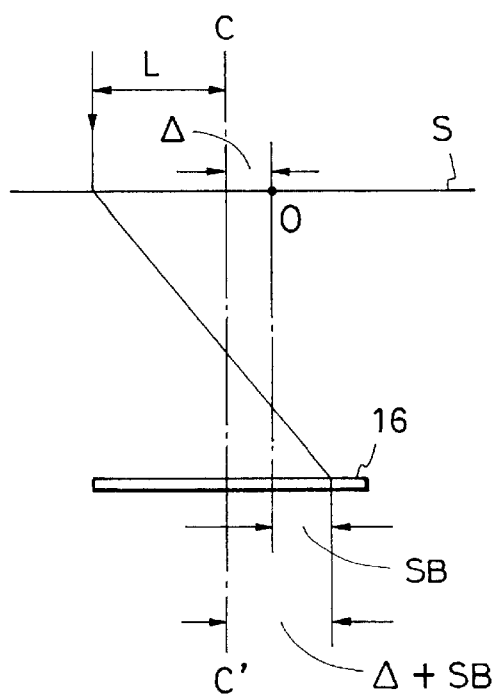

FIG. 3B shows a case in which the binary optical element S is turned through an angle of 180° in this state. At this time, the laser light B is radiated onto the position shifted from the center O of the binary optical element S by a distance L+Δ. Since the laser light B forms an image on the CCD sensor 16 with a spherical aberration SB corresponding to L+Δ, the image position on the CCD sensor 16 is represented by Δ+SB. Therefore, the amount of shift of the image position on the CCD sensor 16 when the binary optical element S is turned is detected as 2Δ+(SB–SA).

The binary optical element S is moved by the XY-stage 13 in the XY directions to minimize the amount of shift of the image position. The minimum amount of shift of the image position on the CCD sensor 16 is obtained when the laser light B is radiated onto the center O of the binary optical element S, that is, when the center O of the binary optical element S aligns with the turn axis C–C'. In this state, the periphery of the binary optical element S is cut with the cutting tool 17 shown in FIG. 1, whereby the optical axis and the center of the profile of the binary optical element S are precisely aligned.

Figure 4:
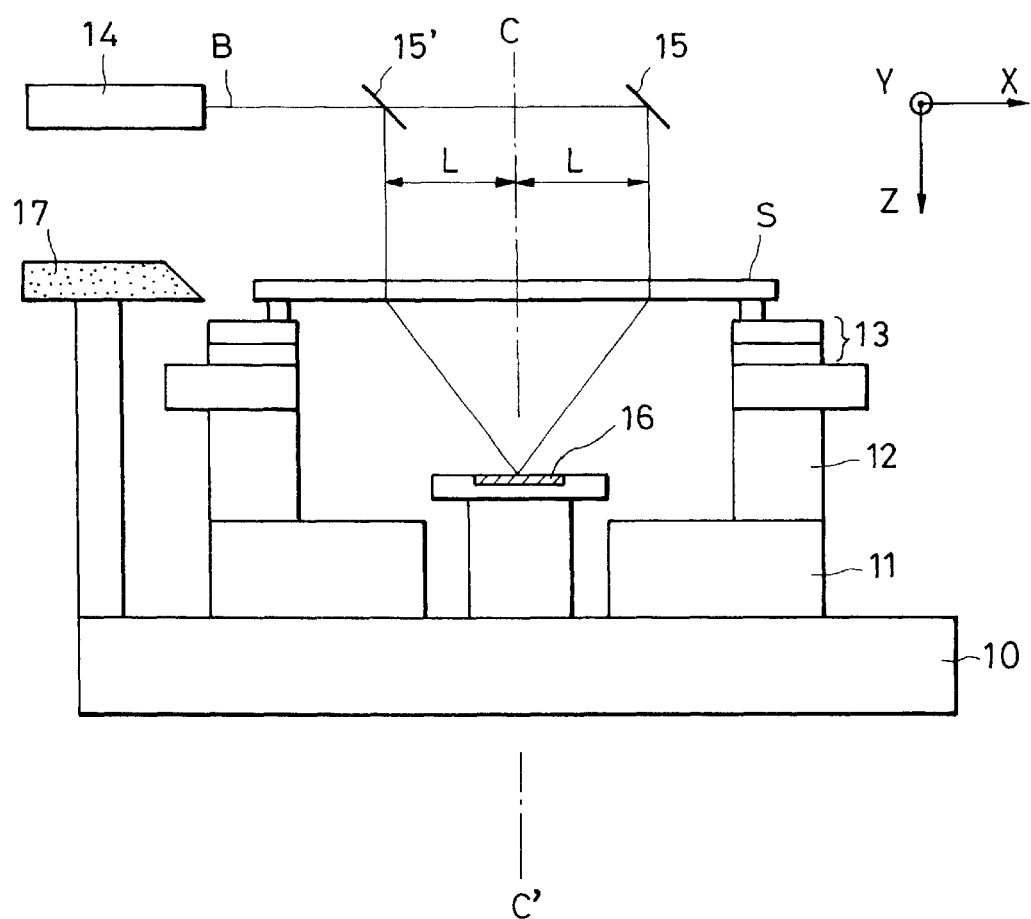
FIG. 4 is a side view of an apparatus for manufacturing a binary optical element according to a second embodiment of the present invention.

FIG. 4 is a side view of an apparatus for manufacturing a binary optical element according to a second embodiment of the present invention. The apparatus of the second embodiment has the same basic construction as the first embodiment except that a half mirror 15' is inserted in the optical path to a reflecting mirror 15 to separate and radiate laser light B onto the positions shifted from the turn axis C–C' by a distance ±L.

Figure 5A:
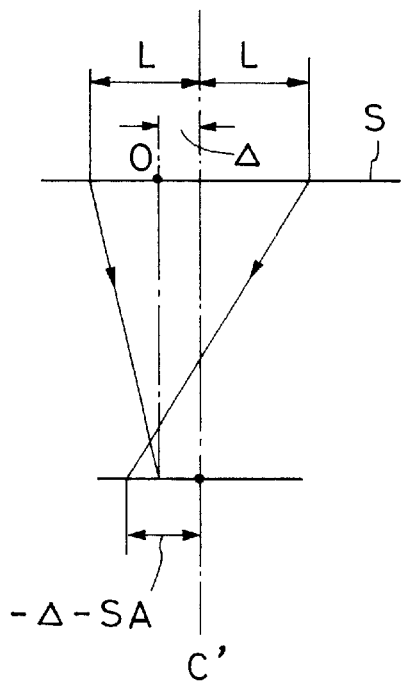
FIG. 5, consisting of FIGS. 5A, 5B and 5C, is an explanatory view showing the relationship between the optical axis and a turn axis.

FIG. 5A shows a state in which the center O of a binary optical element S is offset from the turn axis C–C' by a distance Δ when the binary optical element S is turned, in the same manner as the first embodiment. When the center O of the binary optical element S is thus offset by Δ from the turn axis C–C', the laser light B reflected by the half mirror 15' on the left side in FIG. 5A is radiated onto the position on the binary optical element S shifted by L–Δ from the center O, and the right-side laser light B reflected by the reflecting mirror 15 is radiated onto the position on the binary optical element S shifted by L+Δ from the center O. Therefore, the amount of shift of the right-side laser light B from the turn axis C–C' is larger than that of the left-side laser light B. At this time, the right-side laser light B forms an image at the position on the CCD sensor 16 shifted from the turn axis C–C' by –Δ–SA with a spherical aberration SA corresponding to L+Δ.

Figure 5B:
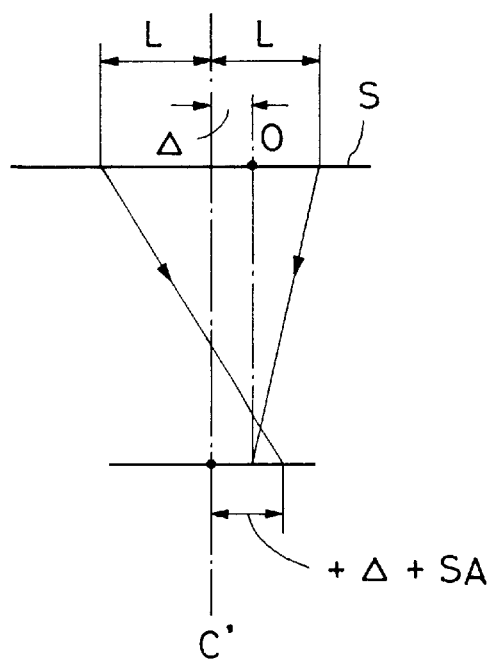

FIG. 5B shows a case in which the binary optical element S is turned through an angle of 180° in this state. Since the left-side laser light B forms an image at the position on a CCD sensor 16 shifted by Δ+SA from the turn axis C–C' as in the above-mentioned embodiment, the amount of shift of the image position on the CCD sensor 16 when the binary optical element S is turned is detected as 2(Δ+SA). Since the amount of shift is thus larger than that of the first embodiment, it is possible to further improve detection accuracy.

Figure 5C:
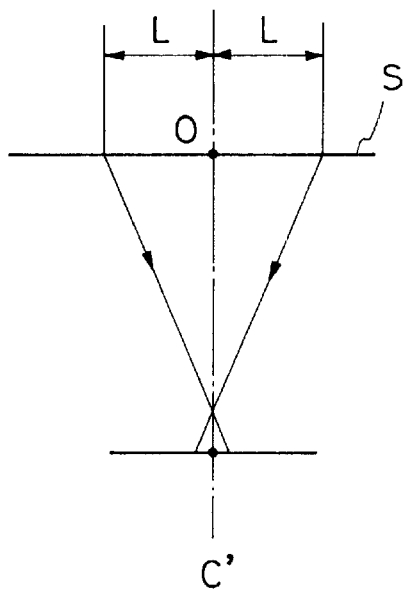

In order to minimize the amount of shift of the image position on the CCD sensor 16, the binary optical element S is moved by an XY-stage 13 in the XY directions. The minimum amount of shift is obtained when the laser lights B are radiated onto the positions that are symmetrically shifted by L from the center O of the binary optical element S, that is, when the center O of the binary optical element S aligns with the turn axis C–C', as shown in FIG. 5C. In this state, the periphery of the binary optical element S is cut with a cutting tool 17 shown in FIG. 4, whereby the optical axis and the center of the profile of the binary optical element S are precisely aligned with each other.

Figure 6:
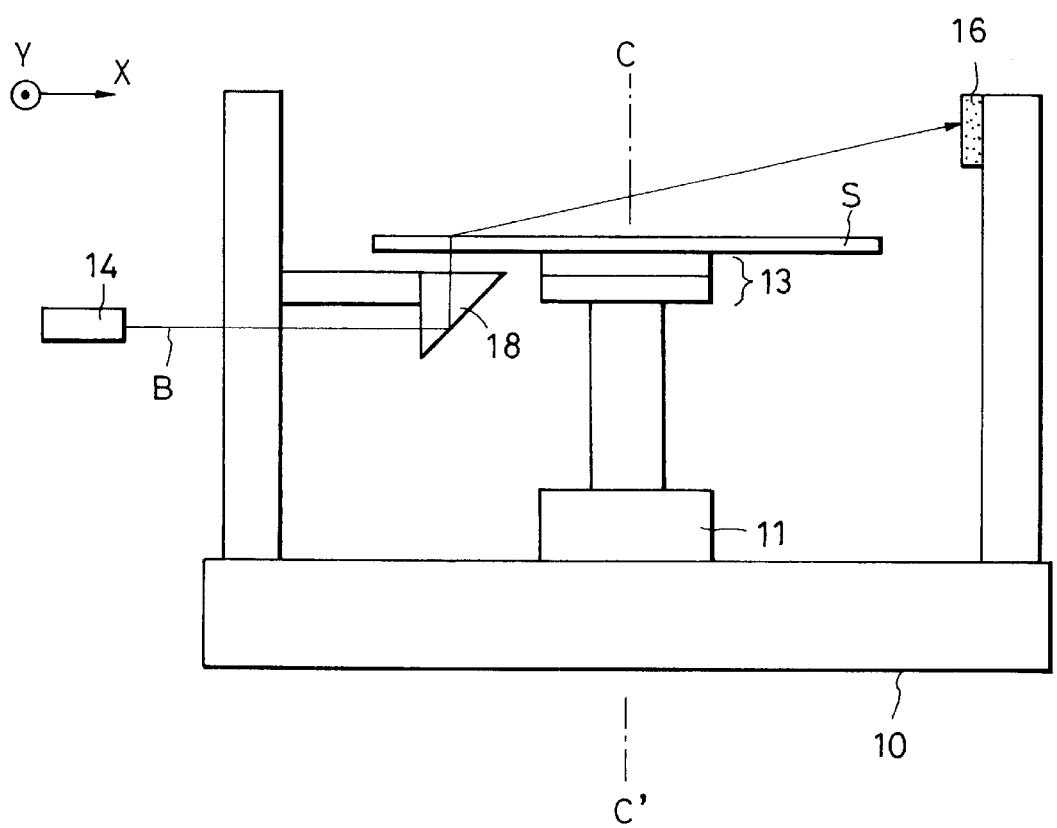
FIG. 6 is a side view of an apparatus for manufacturing a binary optical element according to a third embodiment of the present invention.

FIG. 6 shows an apparatus for manufacturing a binary optical element according to a third embodiment of the present invention. In this embodiment, a θ-stage 11 and an XY-stage 13 are mounted on about the center of a surface plate 10. A binary optical element S is mounted on the XY-stage 13 so that its position in the XY directions relative to the turn center can be adjusted.

In centering the optical axis, a patterned binary optical element S is laid on the XY-stage 13 that is movable in the XY directions. In the state in which the binary optical element S is being turned by the θ-stage 11, laser light B is radiated from a laser source 14 onto the binary optical element S via a prism mirror 18. A high-order diffracted light of the laser light B generated by the binary optical element S is detected by a CCD sensor 16.

When the binary optical element S is turned, if its is center O is offset from the turn axis C–C', the position of the diffracted light on the CCD sensor 16 is shifted. Accordingly, the binary optical element S is moved in the XY directions so that the amount of shift becomes 0. The amount of shift is 0 when the turn axis C–C' and the center O of the binary optical element S align with each other. In this state, the periphery of the binary optical element S is cut with a cutting tool similar to those of the first and second embodiments, which is not shown in FIG. 6, thereby precisely aligning the optical axis and the center of the profile of the binary optical element S with each other.

Figure 15:
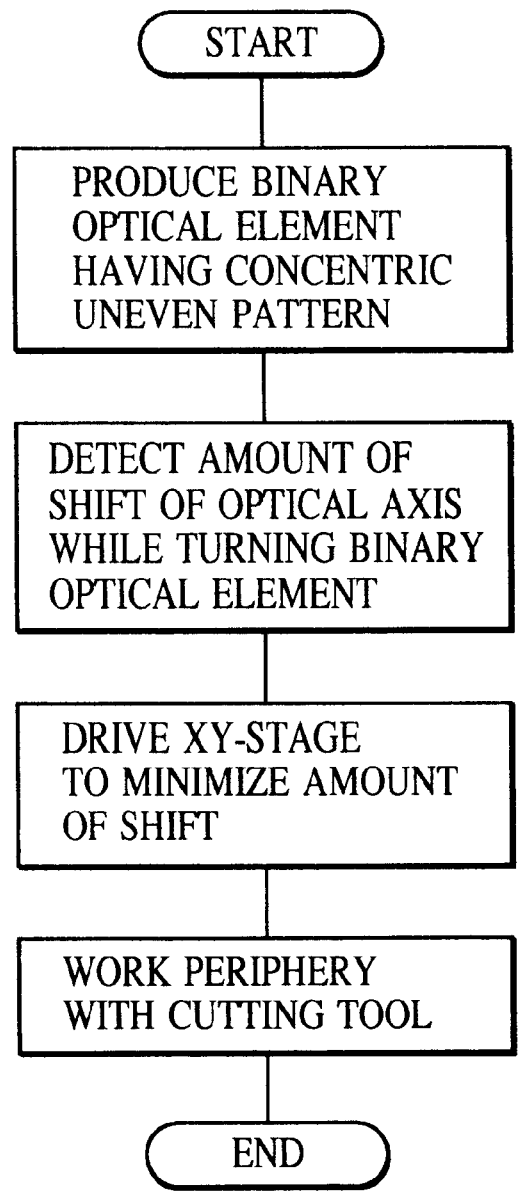
FIG. 15 is a flowchart showing a process of manufacturing binary optical elements of the first to third embodiments.

FIG. 15 is a flowchart showing the processes of manufacturing a binary optical element by utilizing the manufacturing apparatuses of the first to third embodiments.

Figure 7:
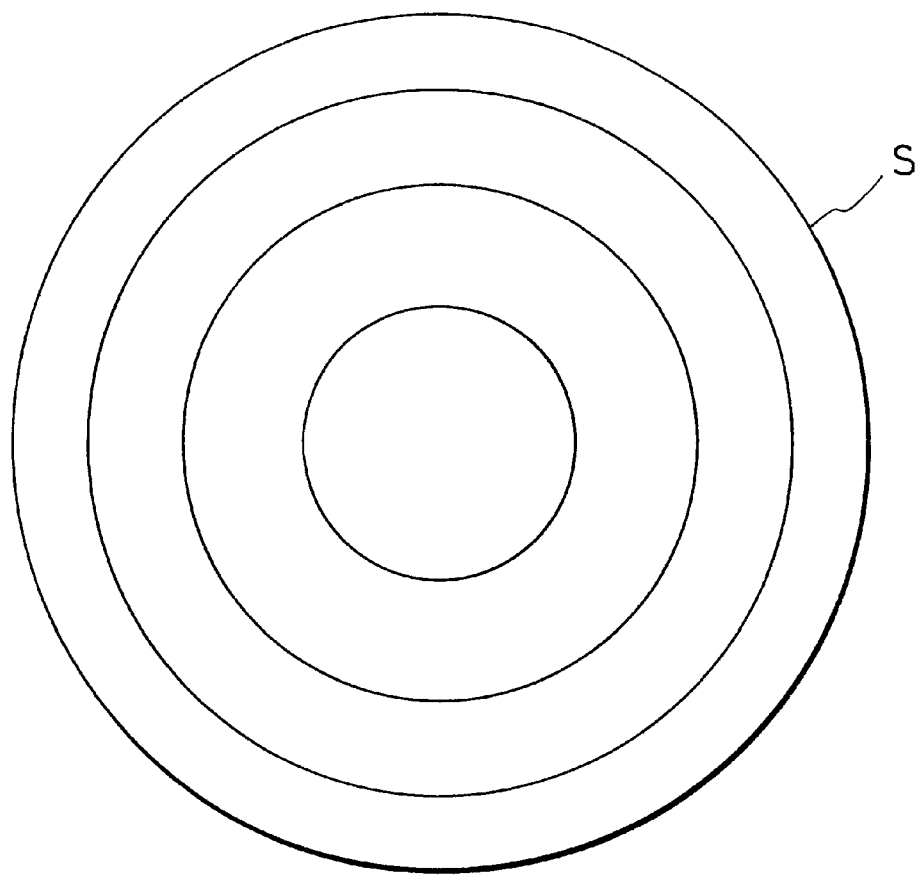
FIG. 7 is a plan view of a binary optical element.
Figure 8:
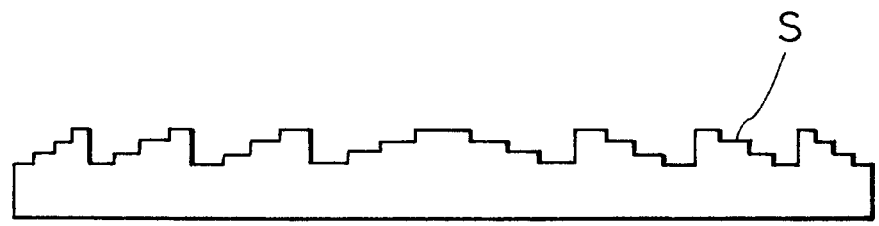
FIG. 8 is a cross-sectional view of the binary optical element.

FIG. 7 is a front view of the binary optical element S whose optical axis is aligned with the center of its profile by the methods of the embodiments described above, and FIG. 8 is a cross-sectional view of the binary optical element S. The cross section of the binary optical element S includes a row of connected similar serrate portions, as shown in FIG. 8. Only the boundaries of the serrate portions are shown by solid lines in FIG. 7, and the boundaries of steps in each serrate portion are left out.

According to the methods of aligning the center of the profile and the optical axis in the embodiments described above, the optical axis of the whole optical system can be precisely adjusted only by aligning the center of the profile of the binary optical element S with the optical axis of another optical element, and the binary optical element S can deliver high optical performance. While the serrate cross-section of the binary optical element S shown in FIG. 8 is shaped like a row of serrate portions each including four steps, even if the number of steps is not four, but eight, sixteen, or the like, it is possible to expect similar advantages in adjusting the optical axis.

Figure 9:
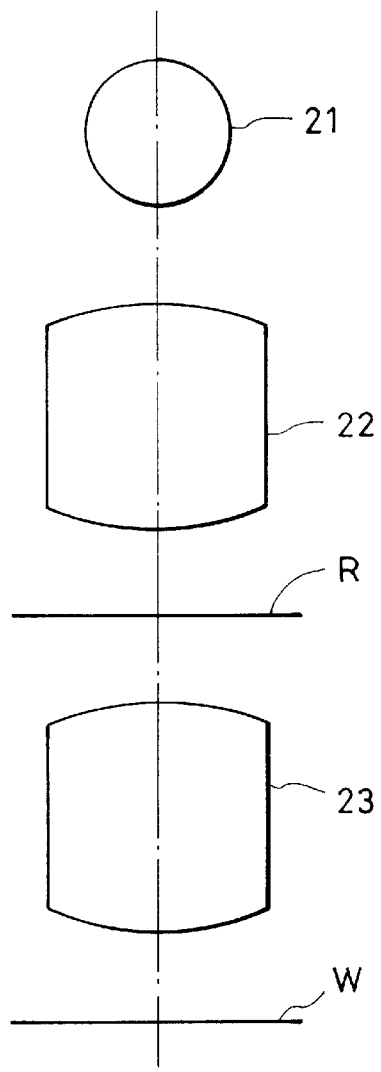
FIG. 9 is a structural view of an optical system in a projection exposure apparatus.
Figure 10:
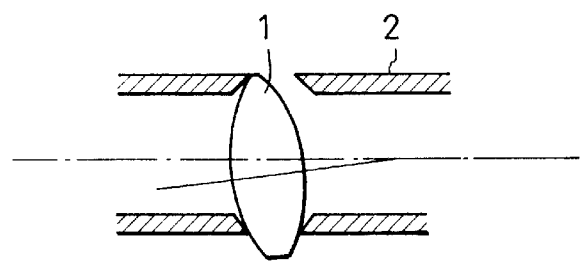
FIG. 10 is an explanatory view showing a conventional method of adjusting the optical axis.
Figure 11:
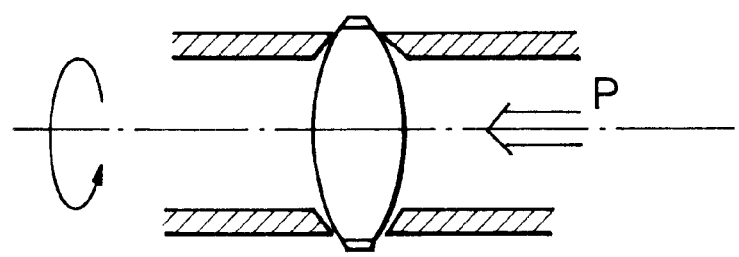
FIG. 11 is an explanatory view showing the conventional method of adjusting the optical axis.
Figure 12:
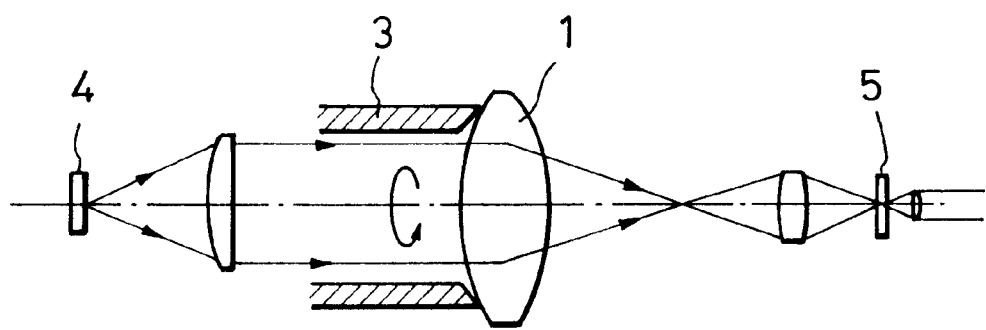
FIG. 12 is an explanatory view showing another conventional method of adjusting the optical axis.

FIG. 9 is a structural view of an optical system in a projection exposure apparatus that utilizes binary optical elements S. Below a light source 21 such as a lamp or a laser are placed an illumination optical system 22 for uniformly illuminating a reticle R with a light beam from the light source 21, and a projection optical system 23 for projecting a projection pattern formed on the reticle R onto a wafer W. Binary optical elements S are located in the illumination optical system 22 and the projection optical system 23.

Figure 13:
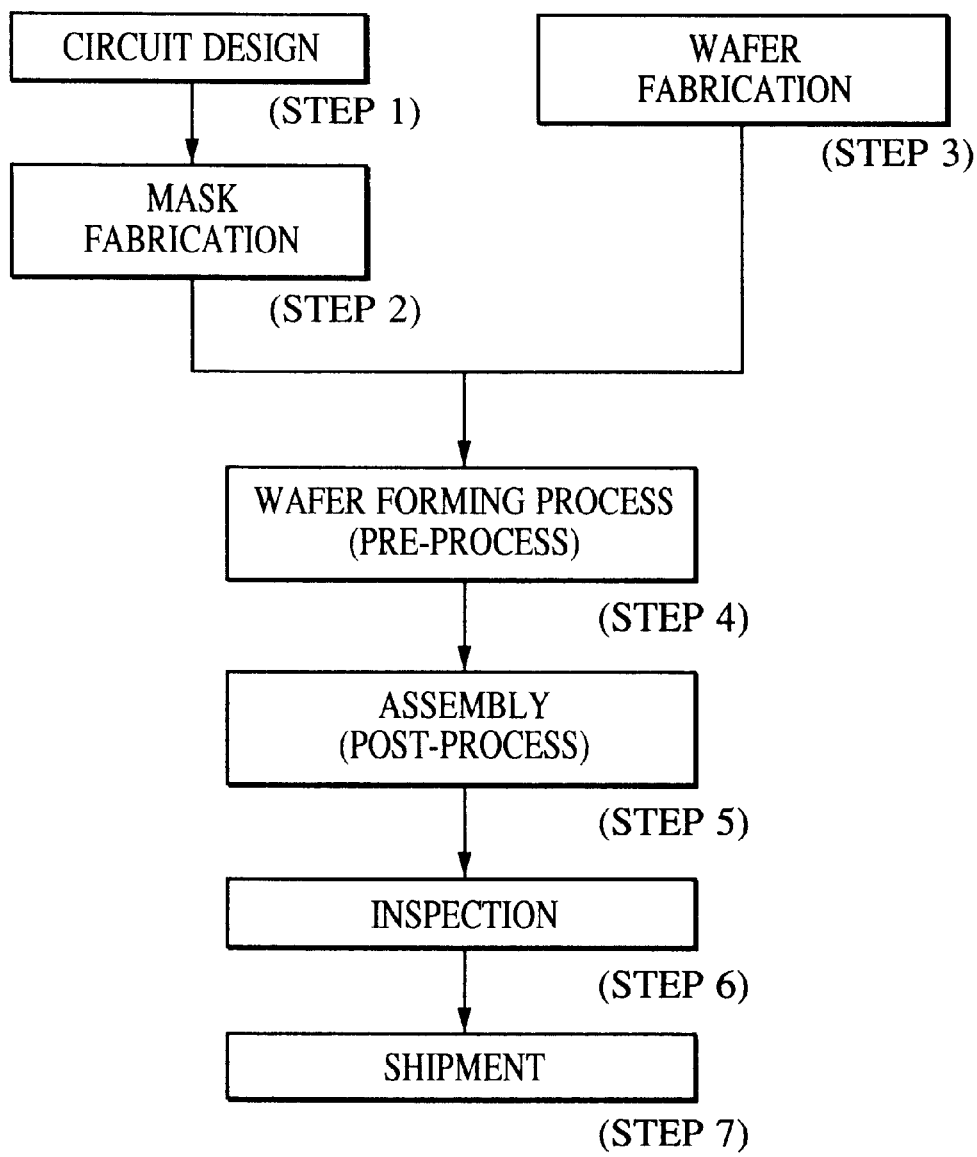
FIG. 13 is a flowchart showing a process of manufacturing a semiconductor device.
Figure 14:
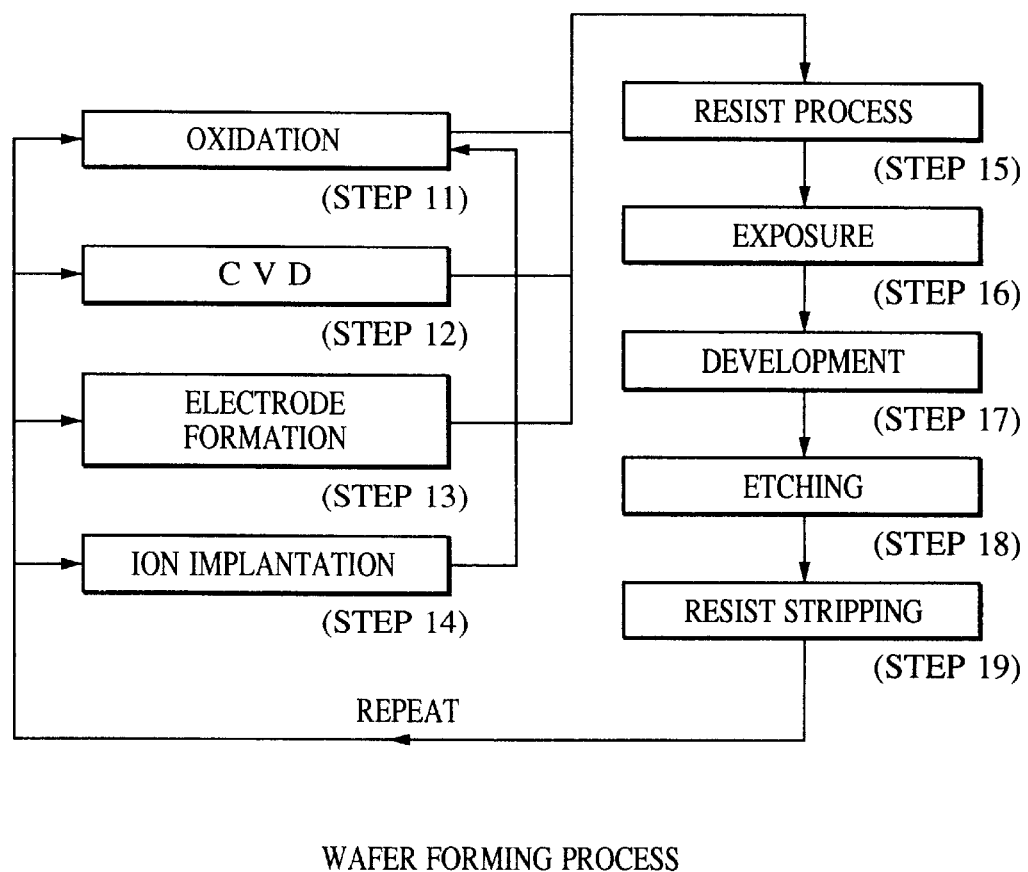
FIG. 14 is a detailed flowchart of a wafer forming process shown in FIG. 13.

Such incorporation of high-precision binary optical elements S in the optical system of the projection exposure apparatus makes it possible to improve the optical performance of the overall projection exposure apparatus. Furthermore, it is possible to precisely manufacture semiconductor devices such as ICs and LSIs, liquid crystal devices, image pickup devices such as CCDs, magnetic elements such as magnetic heads, and optical elements such as binary optical elements by utilizing the projection exposure apparatus shown in FIG. 9 according to manufacturing processes shown in FIGS. 13 and 14.

As mentioned above, the optical axis of the diffractive optical element disclosed in the above embodiments can be precisely positioned by alignment with the center of the profile of the diffractive optical element.

Furthermore, the optical equipment disclosed in the embodiments can provide excellent optical properties through the use of the diffractive optical element whose optical axis can be positioned with high accuracy. In particular, the projection exposure apparatus disclosed in the above embodiment is able to precisely manufacture various types of devices.

The apparatuses of manufacturing a diffractive optical element that are disclosed in the embodiments detect the relative offset between the optical path of the diffractive optical element and the turn axis of turning means, and compensate the offset, thereby precisely aligning the optical axis and the center of the profile of the diffractive optical element with a simple structure.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a diffractive optical element, which is turned by a turntable and has a light-bending function, said method comprising:
    a first step of forming a diffraction grating of the diffractive optical element;
    a second step of detecting the state of light transmitted from a light source through the diffractive optical element while turning the diffractive optical element about a turn axis of the turntable;
    a third step of adjusting relative positions of an optical axis of the diffractive optical element and the turn axis to minimize a detected amount of shift of the light detected by said second step; and
    a fourth step of cutting an outer periphery of the diffractive optical element, so that the optical axis of the diffractive optical element aligns with a center of a profile of the diffractive optical element.

2. A diffractive optical element manufactured according to the method of claim 1, wherein the light-bending function is provided by the diffraction grating, and the diffraction grating is formed on a flat surface.

3. A diffractive optical element according to claim 2, wherein the diffraction grating is shaped like a staircase in cross section.

4. A projection exposure apparatus, comprising:
    an illumination optical system for illuminating a reticle with a pattern formed thereon; and
    a projection optical system for projecting the pattern onto a wafer,
    wherein at least one of said illumination optical system and said projection optical system has a diffractive optical element manufactured by a method according to claim 1.

5. A device manufacturing method, comprising the steps of:
    applying a photosensitive material onto a wafer;
    transferring a pattern formed on a reticle onto the wafer by using a projection exposure apparatus claimed in claim 4, and
    developing the pattern transferred onto the wafer.

6. A method according to claim 1, wherein said fourth step is performed after said first step.

7. A diffractive optical element manufacturing apparatus for manufacturing a diffractive optical element having a diffraction grating formed on a substrate, said apparatus comprising:
    a turning unit adapted to turn the diffractive optical element about a turn axis;
    a detector adapted to detect an offset between the turn axis and an optical axis of the diffraction grating;

position adjustment unit adapted to adjust relative positions of the turn axis and the diffraction grating based on a detection result provided by said detector; and a cutter adapted to cut an outer periphery of the diffractive optical element while the diffractive optical element is being turned by said turning unit so that the optical axis of the diffraction grating aligns with a center of a profile of the diffractive optical element.

8. A manufacturing apparatus according to claim 7, wherein said detector comprises:

a light emitting unit adapted to cause light to enter the diffractive optical element; and a light receiving unit adapted to receive light emitted from the diffractive optical element.

* * * * *